(12) United States Patent
Khalaf et al.

(10) Patent No.: US 11,791,785 B2
(45) Date of Patent: Oct. 17, 2023

(54) SIGN SWITCHING CIRCUITRY

(71) Applicant: IMEC vzw, Leuven (BE)

(72) Inventors: Khaled Khalaf, Aarschot (BE); Steven Brebels, Heverlee (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/128,537

(22) Filed: Dec. 21, 2020

(65) Prior Publication Data

US 2021/0194445 A1    Jun. 24, 2021

(30) Foreign Application Priority Data

Dec. 23, 2019  (EP) ..................................... 19219263

(51) Int. Cl.
*H03F 3/45* (2006.01)
*H03G 3/30* (2006.01)

(52) U.S. Cl.
CPC ....... *H03F 3/45183* (2013.01); *H03G 3/3036* (2013.01); *H03F 2200/451* (2013.01); *H03G 2201/103* (2013.01); *H03G 2201/307* (2013.01)

(58) Field of Classification Search
CPC .......... H03F 3/45183; H03F 2200/451; H03F 2203/45318; H03F 2203/45481; H03F 3/45237; H03F 3/45179; H03F 3/45192; H03F 3/45089; H03G 3/3036; H03G 2201/103; H03G 2201/307; H03G 1/0023; H03G 1/0088; H03G 3/45098; G11C 7/062
USPC ........................ 330/253, 254, 51, 124 R, 295
See application file for complete search history.

(56) References Cited

U.S. PATENT DOCUMENTS

| | | | |
|---|---|---|---|
| 3,482,180 A | 12/1969 | Martens | |
| 6,750,709 B2 * | 6/2004 | Raghavan | ............. H03F 1/3223 330/149 |
| 6,788,142 B2 * | 9/2004 | Li | ...................... H03F 3/45219 330/253 |

(Continued)

FOREIGN PATENT DOCUMENTS

WO    WO 2018/119153 A2    6/2018

OTHER PUBLICATIONS

Extended European Search Report dated Mar. 31, 2020 issued in European Application No. 19219263.1.

*Primary Examiner* — Khanh V Nguyen
(74) *Attorney, Agent, or Firm* — Knobbe, Martens, Olson & Bear, LLP

(57) ABSTRACT

A sign switching circuitry is disclosed. In one aspect, the sign switching circuitry includes a first and second differential common-source amplifier having common differential input nodes and common differential output nodes configured such that a differential input signal applied at the common differential input nodes is amplified to a differential output signal at the common differential output nodes with a fixed gain by the first amplifier and by the fixed gain with opposite sign by the second amplifier. The sign switching circuitry also includes a switching circuitry configured to activate the first common-source amplifier and deactivate the second common-source amplifier to amplify the differential input signal by the fixed gain, and to activate the second common-source amplifier and deactivate the first common-source amplifier to amplify the differential input signal by the fixed gain with opposite sign.

19 Claims, 5 Drawing Sheets

(56) References Cited

U.S. PATENT DOCUMENTS

| | | | | |
|---|---|---|---|---|
| 6,965,255 B2* | 11/2005 | Gans | ................... | G11C 7/065 |
| | | | | 327/51 |
| 7,667,536 B2* | 2/2010 | Ogawa | ............... | H03F 3/45219 |
| | | | | 330/261 |
| 8,330,537 B1* | 12/2012 | Ghorpade | ........... | H03F 3/45192 |
| | | | | 330/136 |
| 8,581,639 B2* | 11/2013 | Kameda | ............. | H03F 3/45654 |
| | | | | 327/108 |
| 8,854,132 B2* | 10/2014 | Lesso | .................. | H03F 3/2173 |
| | | | | 330/251 |
| 9,356,570 B2* | 5/2016 | Rombach | ............ | H03F 3/45183 |
| 10,734,974 B1* | 8/2020 | Jagannathan | .. | H03K 19/018528 |
| 11,251,760 B2* | 2/2022 | Kusuda | .................... | H03F 3/72 |
| 2019/0068145 A1* | 2/2019 | Lee | .................... | H03F 3/45659 |

* cited by examiner

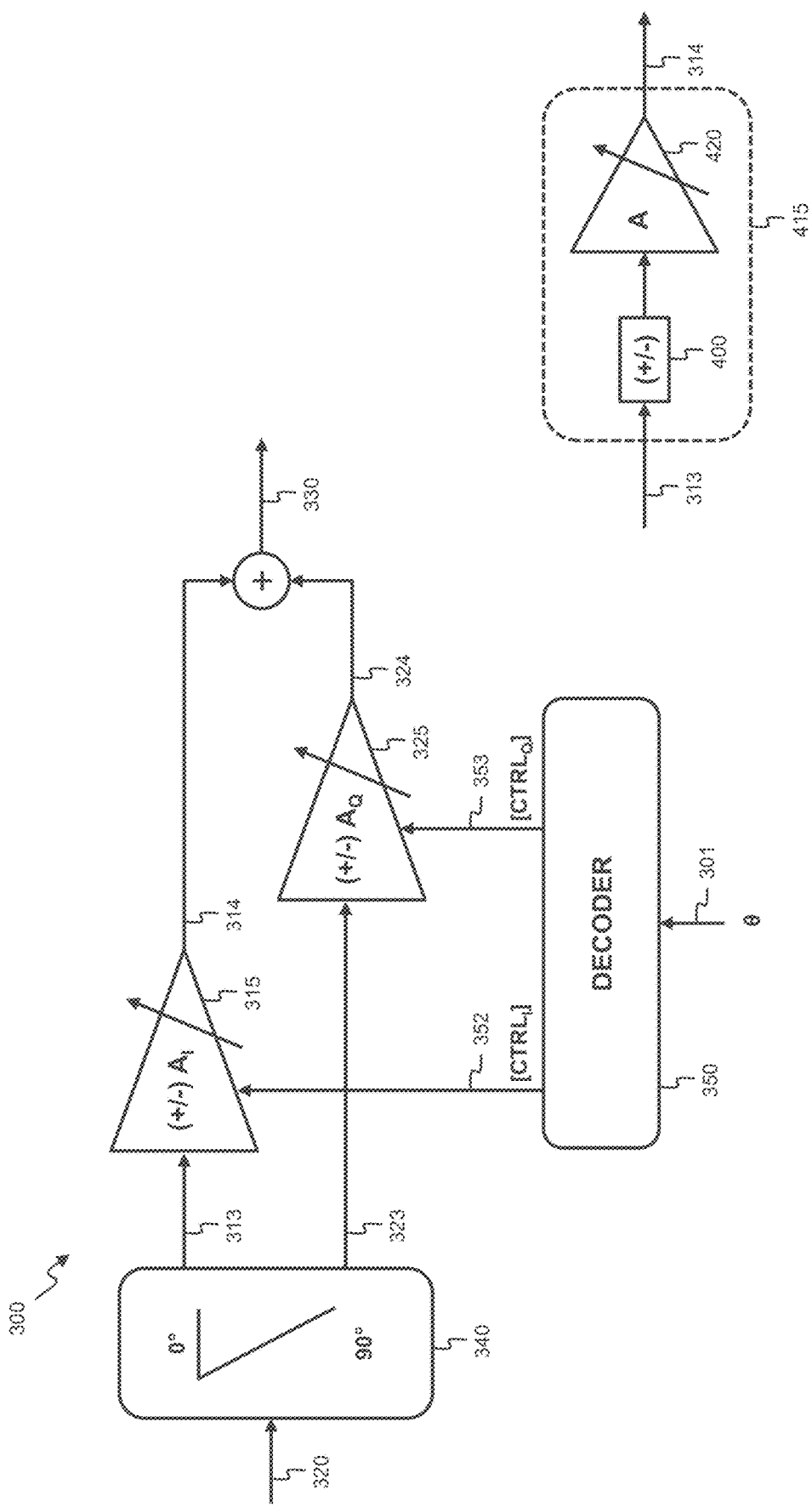

SIGN SWITCHING CIRCUITRY

CROSS-REFERENCE TO RELATED APPLICATIONS

This application claims foreign priority to European Application No. 19219263.1, filed Dec. 23, 2019, the contents of which are incorporated by reference herein in its entirety.

BACKGROUND

Technological Field

The disclosed technology relates to a sign switching circuitry, a variable gain circuitry, a phase changing circuitry and an RF circuitry.

Description of the Related Technology

A sign switching circuity takes an input signal and produces an output signal with a configurable sign, for example, with the same or opposite sign of the input signal Such a sign switching circuitry may also apply a predefined gain to the input signal, making it an amplifier or attenuator with a configurable sign.

Sign switching circuitries may be applied in a radio-frequency (RF) front-end (FE) for processing RF communication signals, for example, in a variable gain amplifier and in a phase shifter or modulator.

SUMMARY OF CERTAIN INVENTIVE ASPECTS

The scope of protection sought for various embodiments of the disclosed technology is set out by at least the independent claims.

The embodiments and features described in this specification that do not fall within the scope of the independent claims, if any, are to be interpreted as examples useful for understanding various embodiments of the disclosed technology.

Different challenges may be identified when designing a sign switching circuitry such as, for example, power efficiency, voltage headroom, linearity, gain and unwanted feedthrough between the input and output. Amongst others, it is an object of embodiments of the disclosed technology to address these challenges. Other objectives, features and advantages of the disclosed technology will appear from the present disclosure.

According to a first example aspect of the present disclosure, a sign switching circuitry includes a first and second differential common-source amplifier having common differential input nodes and common differential output nodes configured such that a differential input signal applied at the common differential input nodes is amplified to a differential output signal at the common differential output nodes with a fixed gain by the first amplifier and by the fixed gain with opposite sign by the second amplifier, and a switching circuitry configured to activate the first common-source amplifier and deactivate the second common-source amplifier to amplify the differential input signal by the fixed gain, and to activate the second common-source amplifier and deactivate the first common-source amplifier to amplify the differential input signal by the fixed gain with opposite sign.

The sign switching is achievable by switching between two differential common-source amplifiers with opposite gains. The differential input signal is applied to both common-source amplifiers. The deferential output signal is generated by the outputs of both common-source amplifiers. By the switching circuity, one amplifier is activated while the other one is deactivated and vice versa to achieve the sign switching. The first and second differential amplifiers may further be embodied symmetrically including their input and output connections such that the sign switching circuitry becomes symmetric.

By the common-source amplifiers, a common-source push-pull configuration is obtained, thereby allowing amplification or attenuation in combination with the sign switching. Further, by the combination of the two common-source amplifiers, the gate to drain capacitance ($C_{gd}$) of the active common-source amplifier will be neutralized by the gate to drain capacitance of the deactivated amplifier. Because of this, there is no need for a dedicated capacitance for neutralizing the gate to drain capacitance to achieve a high gain and stability. Furthermore, there are no parasitic effects due to the layout differences between the gate to drain capacitance and such a dedicated neutralization capacitor. Also, the neutralization will be optimal as the gate to drain capacitances are matched by design and, thus, mismatch due to process variations is avoided. Further, the switching circuitry is not part of the signal path as is the case in sign switching circuitries that use passive switches. As a result, additional signal loss is avoided because the signals do not travel through the switching circuitry.

According to example embodiments, the switching circuitry includes a first switch configured to connect a source node of the first differential common-source amplifier with a first supply node of a voltage supply when activating the first differential common-source amplifier, and a second switch configured to connect a source node of the second differential common-source amplifier with the first supply node when activating the second differential common-source amplifier.

In other words, the common-source amplifiers are source switched to achieve the activation.

According to example embodiments, the first switch is further configured to connect the source node of the first differential common-source amplifier with a second supply node of the voltage supply when activating the second differential common-source amplifier, and the second switch is further configured to connect the source node of the second differential common-source amplifier with the second supply node of the voltage supply when activating the first differential common-source amplifier.

The source node is thus actively pulled in the deactivated state, preventing it from floating and increasing the switching speed of the sign switching circuitry.

According to example embodiments, the first and/or second switches are inverter switches.

According to example embodiments, the first supply node is a common ground node.

According to a second example aspect, a variable gain circuitry is configured to amplify an analog input signal by a configurable positive or negative gain to an analog output signal. The variable gain circuitry including a plurality of the sign switching circuitries according to embodiments of the first example aspect is connected in parallel such that the differential output signals of the respective sign switching circuitries contribute to the analog output signal.

In other words, the variable gain is achieved by coupling a plurality of the sign switching circuitries in parallel. By selecting the sign of the sign switching circuitries, a configurable positive or negative contribution to the gain is achieved. By using the sign switching circuitry according to the first aspect, the total gate to drain capacitance of the amplifier will be neutralized resulting in a more linear amplification of the input signal.

According to example embodiments, the common differential output nodes of the respective sign switching circuitries are connected together, thereby forming differential output nodes of the variable gain circuitry for outputting the analog output signal.

According to example embodiments, the variable gain circuitry further includes a decoding circuitry configured to decode the configurable positive or negative gain to sign switching commands for the respective sign switching circuitries.

According to a third example aspect, a phase changing circuitry is disclosed for shifting or modulating the phase of an input signal by a configurable phase angle that includes one or more of the sign switching circuitries according to the first example aspect and/or one or more variable gain circuitries according to the second example aspect.

According to example embodiments, the one or more sign switching circuitries and/or variable gain circuitries are configured to switch the sign of an in-phase (I) and/or quadrature-phase (Q) portion of the input signal.

According to a fourth example aspect, an RF circuitry includes the phase changing circuitry according to the third example aspect.

BRIEF DESCRIPTION OF THE DRAWINGS

Some example embodiments will now be described with reference to the accompanying drawings.

FIG. 3 shows an example embodiment of a phase changing circuitry.

FIG. 4 shows another example embodiment of a variable gain amplifier.

DETAILED DESCRIPTION OF CERTAIN ILLUSTRATIVE EMBODIMENTS

Figure 1C:
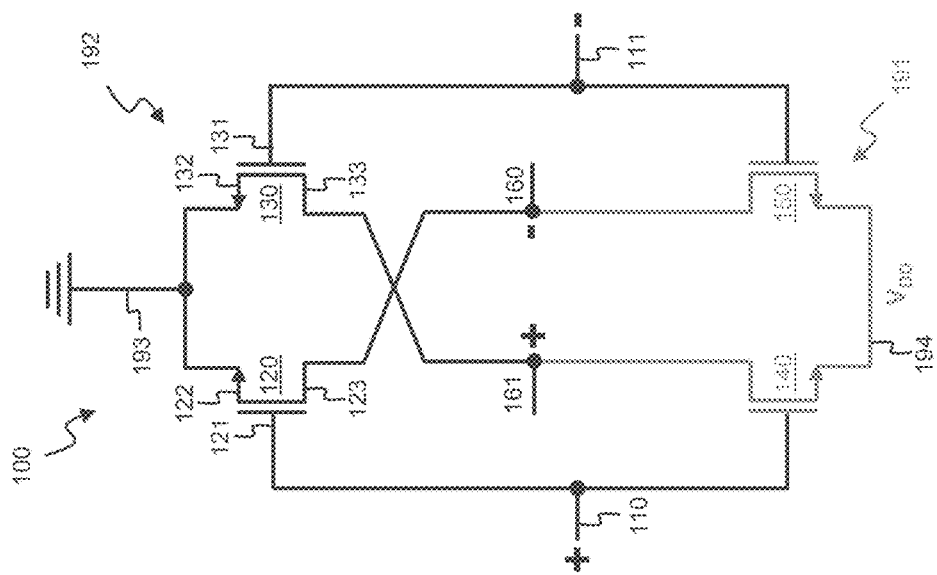
FIGS. 1A-C show example embodiments of a sign switching circuitry.
Figure 1B:
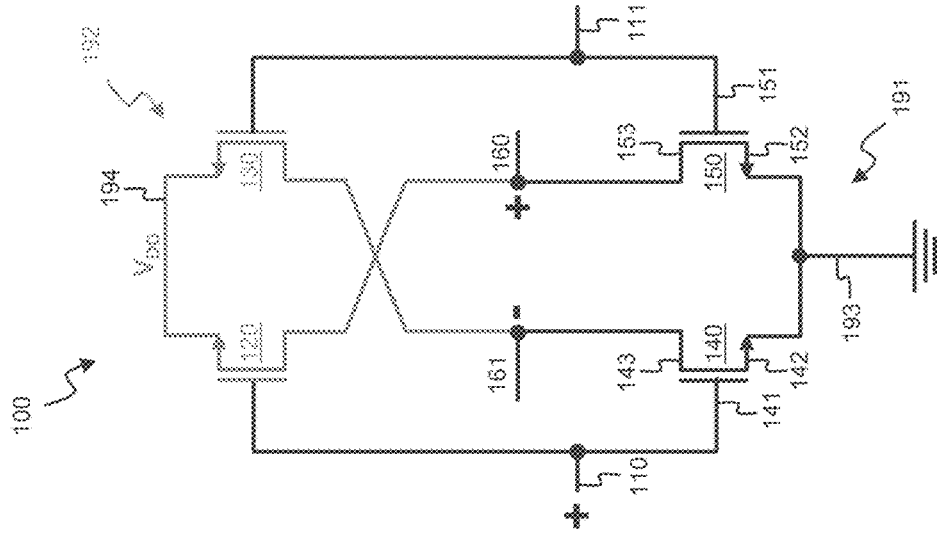
Figure 1A:
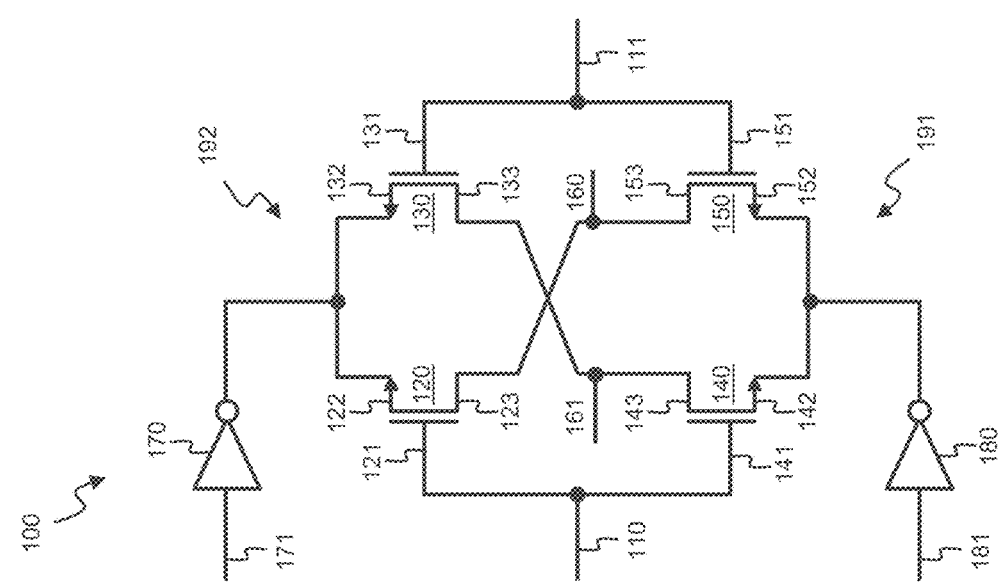

FIG. 1A illustrates a sign switching circuitry 100 for changing the sign of a differential analog input signal 110-111 to a differential analog output signal 160-161. The differential input signal 110-111 may be represented by the difference between the voltage presented at input node 110 and the voltage presented at input node 111. Output nodes 160-161 are couplable to a differential load (not shown). Sign switching circuitry 100 will generate currents between nodes 160-161 and the differential load. A differential output current may then be considered as proportional to the difference between the current at node 160 and the current at node 161. This differential current flowing through the load creates a differential output signal 160-161 as proportional to the difference between the voltage presented at output node 160 and the voltage presented at output node 161.

Sign switching circuitry 100 includes a first differential common source amplifier circuitry 191 and a second differential common source amplifier circuitry 192. The first differential common source amplifier circuitry 191 includes a first metal-oxide-semiconductor field-effect transistor (MOSFET or MOS) transistor 140 and a second MOS transistor 150. The gates 141, 151 of the respective transistors 140, 150 are connected to the respective input nodes 110, 111. The sources 142, 152 of the respective transistors 140, 150, are connected together and further connected to a switching circuitry 180 that is configured to activate or deactivate the first differential common source amplifier circuitry 191. Switching circuitry 180 is operable by an input switching signal 181. The drains 143, 153 of the respective transistors 140, 150 are connected to the respective output nodes 161, 160. The second differential common source amplifier circuitry 192 includes a first metal-oxide-semiconductor field-effect transistor (MOSFET or MOS) transistor 120 and a second MOS transistor 130. The gates 121, 131 of the respective transistors 120, 130 are connected to the respective input nodes 110, 111. The sources 122, 132 of the respective transistors 120, 130, are connected together and further connected to a switching circuitry 170 that is configured to activate or deactivate the second differential common source amplifier circuitry 192. Switching circuitry 170 is operable by an input switching signal 171. The drains 123, 133 of the respective transistors 120, 130 are connected to the respective output nodes 160, 161. The first and second differential common source amplifier circuitry are configured to have an equal gain, for example, by equally sizing transistors 120, 130, 140 and 150. The configured gain may be any value greater than zero. When the configured gain is smaller than one, the common source amplifier circuitry will attenuate the differential input signal 110-111 and operate as an attenuator. When the configured gain is one, the common source amplifier circuitry will operate as a buffer between its input and output, for example, as a pure sign switching circuitry. When the configured gain is greater than one, the common source amplifier circuitry will operate as an amplifier. The first and second differential common source amplifier circuitries 191 and 192 may further be embodied symmetrically around the horizontal axis including their input and output connections. This way, the sign switching circuitry 100 becomes symmetric on the x-axis.

FIG. 1B shows the sign switching circuitry 100 in a first mode of operation. In this first mode of operation, the first differential common source amplifier circuitry 191 is activated. This is done by configuring switching circuitry 180 by switching signal 181 such that the common source nodes 142, 152 are connected with the first voltage supply node 193. As transistors 140, ISO are nMOS type transistors, the first voltage supply node corresponds to the lowest voltage supply node, for example, the common ground node or negative voltage supply. In the first mode of operation, the second differential common source amplifier circuitry 192 is deactivated by deactivating transistors 120, 130. This may, for example, be done by configuring switching circuitry 170 by switching signal 171 such that the common source nodes 122, 132 are connected with a second voltage supply 194, thereby disabling transistors 120, 130. As transistors 120, 130 are nMOS type transistors, the second voltage supply node corresponds to the highest voltage supply node, for example, the positive voltage supply. In this first mode of operation, the differential input signal 110-111 is amplified by a positive gain to differential output signal 160-161. In this first mode of operation, the gate to drain capacitance between gate 141 and drain 143 and the gate to drain capacitance between gate 151 and drain 153 are neutralized by the gate to drain capacitance between gate 121 and drain 123 and the gate to drain capacitance between gate 131 and drain 133.

FIG. 1C shows the sign switching circuitry 100 according to a second mode of operation. In this second mode of operation the second differential common source amplifier circuitry 192 is activated. This is done by configuring switching circuitry 170 by switching signal 171 such that the common source nodes 122, 132 are connected with first voltage supply node 193. In the second mode of operation, the first differential common source amplifier circuitry 191 is deactivated by deactivating transistors 140, 150. This may, for example, be done by configuring switching circuitry 180 by switching signal 181 such that the common source nodes 142, 152 are connected with second voltage supply 194, thereby disabling transistors 140, 150. In this second mode of operation, the differential input signal 110-111 is amplified by a negative gain to differential output signal 160-161. In this second mode of operation, the gate to drain capacitance between gate 121 and drain 123 and the gate to drain capacitance between gate 131 and drain 133 are neutralized by the gate to drain capacitance between gate 141 and drain 143 and the gate to drain capacitance between gate 151 and drain 153.

With switching signals 171 and 181, the sign switching circuitry 100 may be switched between the first and second operation modes, thereby respectively achieving a positive or negative amplification of the differential input signal 110-111. In both modes, the parasitic gate to drain capacitances of the active common source amplifier circuitry is neutralized by the gate to drain capacitances of the inactive common source amplifier circuitry. The inherent neutralization results in a higher gain and higher stability of the sign switching circuitry. Furthermore, no additional custom neutralization capacitance has to be foreseen.

Switching circuitries 180, 170 may comprise an nMOS transistor configured as a switch between the source nodes and supply node 193. Switching signals 171, 181 may then be made complementary to make either one of the switches conducting. When only using such an nMOS type transistor, the source node of the inactive common source amplifier will be floating. Advantageously, switching circuitries 180, 170 are implemented as complementary switches, also referred to as CMOS switches or inverters in a MOS technology. Such a switch will connect the source node of the common source amplifier to the first supply node 193 in the active state and to the second supply node 194 in the inactive state. As the source node is connected actively to the second supply, the corresponding transistors will be brought to a deep off state and the source nodes will have a predictable voltage. This results in a faster switching between the different operation modes and, thus, in a faster sign switching of the sign switching circuitry 100.

Advantageously, the output nodes 161 and 160 are biased to high voltage. This way, the common source amplifier 191, 192 will be active when the common source is connected to the first voltage supply 193 and will be inactive when the common source is connected to the second voltage supply 194. This may, for example, be achieved by biasing output nodes 160 and 161 to the second voltage supply 194, that is, the output voltage at nodes 160 and 161 is around the second voltage supply 194 when there is no differential signal applied to inputs 110, 111. Such biasing may be done by an inducting coupling between the load and the second voltage supply 194.

Sign switching circuitry may be applied for sign switching of RF differential communication signals, for example, for sign switching of Super High Frequency (SHF) and Extremely High Frequency (EHF) communication signals. Using a 28 nm CMOS technology, switching circuitry may operate on analog signals up to around 150 GHz and perform sign switching up to speeds of around 15 GS/s.

Figure 2:
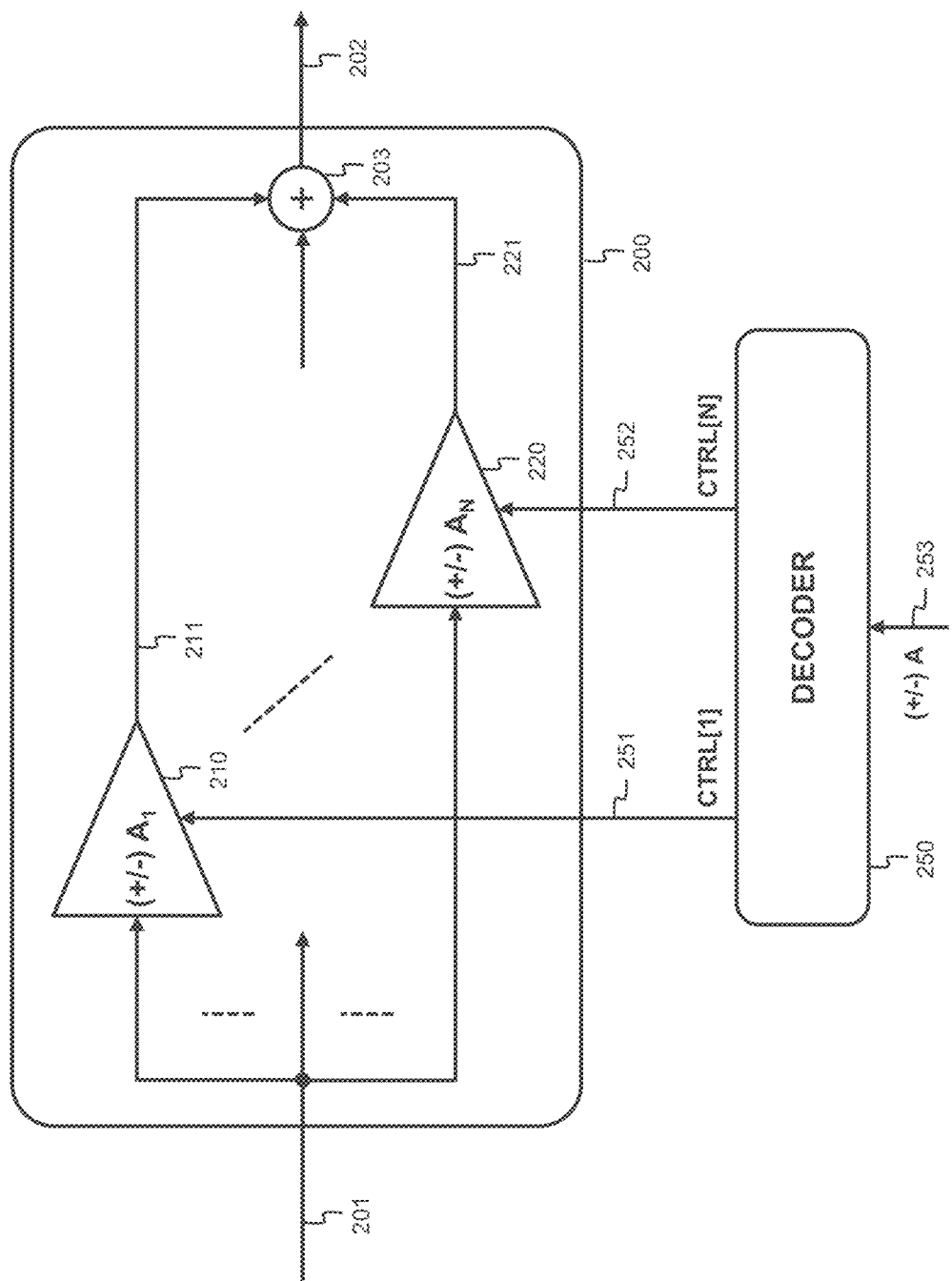
FIG. 2 shows an example embodiment of a variable gain amplifier.

FIG. 2 shows a variable gain amplifier (VGA) 200 according to an example embodiment VGA 200 may amplify a differential input signal 201 by a variable gain to a differential output signal 202. To this purpose, VGA 200 includes a plurality of fixed gain sign switching amplifiers 210, 220. Fixed gain sign switching amplifiers 210, 220 may be embodied by sign switching circuitries 100. The differential input signal 201 is then used as differential input signal 110-111 of the respective sign switching circuitries 100. The differential output signal 160-161 of the sign switching circuitry 100 then corresponds to the respective differential output signals 211, 221 of the fixed gain sign switching amplifiers 210, 220. These respective differential output signals 211, 221 are added together, via summing block 203, to form the differential output signal 202 of the VGA 200. To this respect, the output node 160 of the switching circuitries 100 may be connected with one node of a differential load (not shown). Likewise, output node 161 of the switching circuitries 100 may be connected with another node of the differential load that is driven by the VGA 200. By these connections, the differential output currents of fixed gain sign switching amplifiers 210, 220 will be added together as functionally illustrated by summing block 203. Differential output signal 202 may then be represented by this differential output current or by the differential output voltage as generated by the current flowing through the differential load.

The variable gain of VGA 200 is controlled by control signals 251, 252 controlling the respective fixed gain sign switching amplifiers 210, 220. Control signal 251 controls amplifier 210 to amplify input signal 201 by a positive gain $A_1$ or by a negative gain $-A_1$. Control signal 252 controls amplifier 220 to amplify input signal 201 by a positive gain $A_N$ or by a negative gain $-A_N$. The total configured gain A 253 of the VGA will then be formed by the sum of the configured gains of the respective fixed gain amplifiers 210, 220. The total configured gain A 253 may be translated by a decoding circuitry into the individual control signals 251, 252. By the sign switching capabilities of fixed gain amplifiers 210, 220, the total configurable gain may be positive or negative. An individual control signal 251 may then connect as signal 181 to switching circuitry 180 and its complement or inverse may connect as signal 171 to switching circuitry 170. This way, sign switching circuitry 100 may be configured by a single information bit into the first or second operation mode as illustrated by FIGS. 1B and 1C. Alternatively, control signals 171 and 181 may be controlled separately by decoder 250, for example, by using two information bits for control signal 251, one for each control signal 171 and 181. This way, both common source amplifiers 191 and 192 may be switched off by decoder 250.

FIG. 3 illustrates a phase changing circuitry 300 according to an example embodiment. Circuitry 300 takes a differential RF communication signal 320 as input and changes its phase by a configurable phase angle 301 and then outputs it as a differential RF communication signal 330. The configurable phase angle 301 may be a modulating signal carrying communication data rendering the phase changing circuitry 300 a phase modulator (PM). The configurable phase angle 301 may also be unrelated to the communication data, for example, to statically define the phase angle of the communication signal 320. In such case, the phase changing circuitry 300 may be referred to as a phase shifter (PS). Circuitry 300 includes a first circuitry 340 configured to create a first output 313 of the communication signal having a zero degree phase shift with respect to the input signal 320, that is, an in-phase (I) portion of input signal 320. First circuitry 340 is further configured to create a second output 323 of the communication signal having a 90 degrees phase shift with respect to the input signal 320, that is, a quadrature phase (Q) portion of the signal 320. Circuitry 340 may, for example, be implemented by a 90° (degrees) hybrid coupler. Signals 313, 323 are then fed into respective VGAs 315, 325. VGAs are variable gain and sign switching amplifiers including instances of sign switching circuitry 100. To this respect, VGAs 315 and 325 may be an instance of VGA 200. VGAs 315, 325 amplify the respective signals 313, 323 by a configurable positive or negative gain 352, 353. These gain control signals 352, 353 may then serve as the gain control signal 253 when using the instances of VGA 200. Phase changing circuitry 300 may further include a decoder circuitry 350 for determining the appropriate configurable gains 352, 353 from the configurable phase angle 301. Decoder circuitry 350 and decoder circuitries 250 of the respective VGAs may further be provided as a single decoding circuitry.

FIG. 4 shows a variable gain amplifier (VGA) 415 according to an embodiment. VGA 415 may be used as an alternative for the VGAs 315, 325 in the phase changing circuitry 300. VGA 415 includes an instance 400 of the fixed gain sign switching circuitry 100 and a variable gain amplifier 420. By the combination of both 400 and 420, a variable gain sign switching amplifier 415 is obtained.

Figure 5:
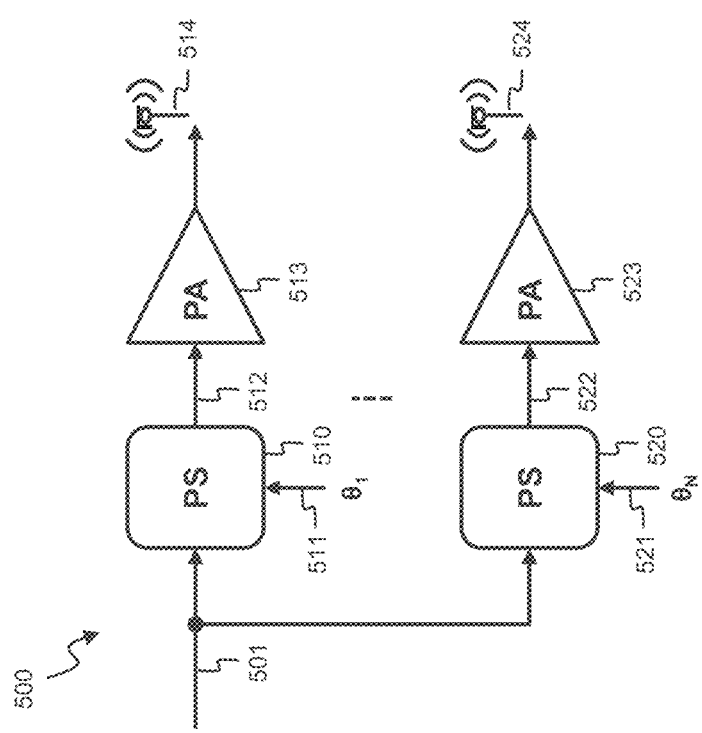
FIG. 5 shows an example embodiment of an RF circuitry for transmitting an RF signal with shifted phase angles across respective antennas.

FIG. 5 illustrates an RF circuitry 500 for transmitting a differential RF communication signal 501 over a plurality of antennas 514 and 524. The signals 512, 522 transmitted over the different antennas are configurable with different phase angles 511, 521 such that beam steering of the wirelessly transmitted signal is achieved. To configure the beam steering characteristics, RF circuitry 500 includes phase shifters 510, 520 for shifting the phase of the RF communication signal 501 to respective phase shifted communication signals 512, 522. Phase shifters 510, 520 include instances of sign switching circuitry 100 for obtaining the phase shifted signals 512, 522. Phase shifters 510, 520 may, for example, correspond to phase shifter 300 or include a VGA 200 or 415 in some form to achieve the phase shifting. These signals on their turn are amplified by power amplifiers 513, 523 and wirelessly transmitted over antennas 514, 524.

Figure 6:
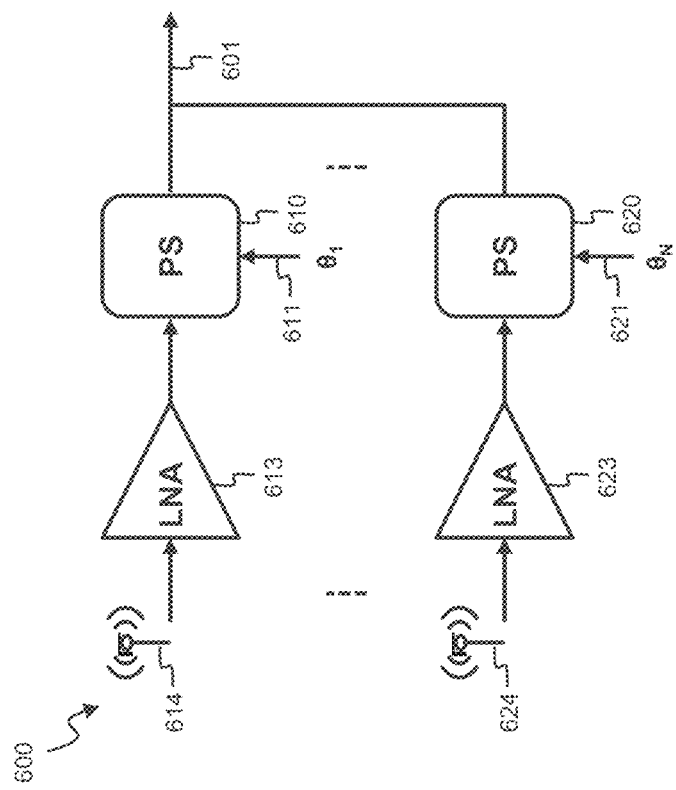
FIG. 6 shows an example embodiment of an RF circuitry for receiving an RF signal with shifted phase angles across respective antennas.

FIG. 6 illustrates an RF circuitry 600 for receiving a differential RF communication signal 601 over a plurality of antennas 614, 624. The signals received by the antennas are first amplified by the respective Low Noise Amplifiers (LNAs) 613, 623. Due to the different positions of the antennas, the signals received by the antennas will be shifted with respect to each other. This phase shift is compensated for by phase shifters 610, 620 that apply a configurable phase shift 611, 621 to the received signals. These phase shifted signals are then added together to obtain the differential RF communication signal 601. Phase shifters 610, 620 include instances of sign switching circuitry 100 in some form for obtaining the phase shifted signals. Phase shifters 610, 620 may, for example, correspond to phase shifter 300 or include the VGA 200 or 415 in some form.

Figure 7:
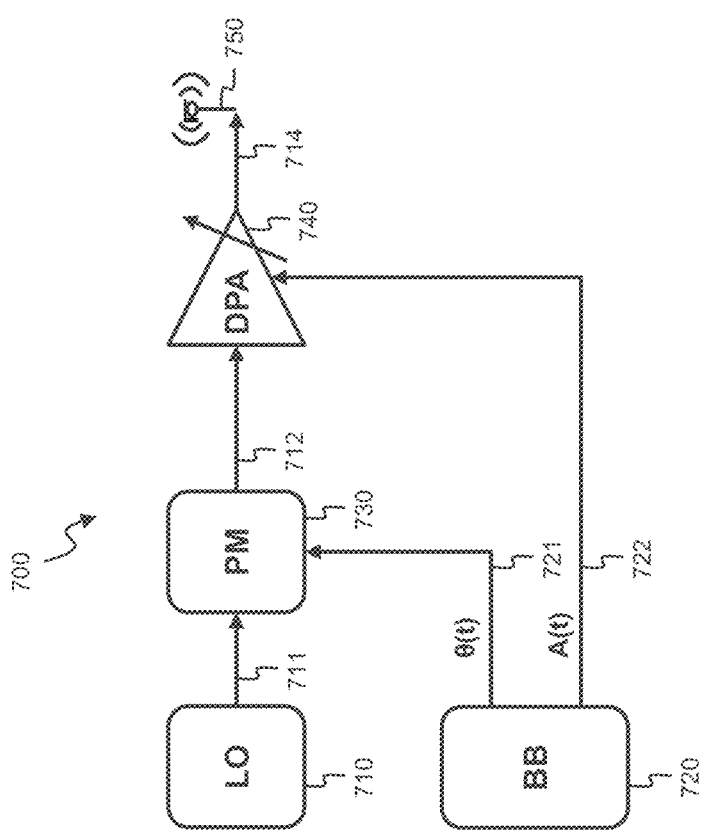
FIG. 7 shows an example embodiment of an RF circuitry for transmitting a phase and amplitude modulated RF signal.

FIG. 7 illustrates an RF circuitry 700 for producing a communication signal 714 and transmitting the signal 714 over an antenna 750. RF circuitry 700 includes an oscillating circuitry 710 for producing an RF signal with a certain constant RF frequency and constant amplitude, for example, a carrier signal 711. Circuitry 700 includes a phase modulator (PM) 730 for modulating the phase of the carrier signal 711 by an information carrying modulating signal 721 to a phase modulated signal 712. Phase modulator 730 includes one or more instances of sign switching circuitry 100 in some form for obtaining the phase modulated signal 712. Phase modulator 730 may, for example, correspond to phase changing circuitry 300, or include a VGA 200 or 415 in some form. Circuitry 700 further includes a digitally controlled power amplifier 740 for amplifying the signal 712 by an amplitude modulating signal 722 to a signal 714 that is modulated in both phase and amplitude. The so-obtained signal 714 may then be transmitted wirelessly over an antenna interface 750.

Phase modulating signal 721 is a digital signal as it controls the phase modulator 730 and the underlying sign switching circuitries 100 in a discrete way. Similarly, amplitude modulating signal 722 is a digital signal as it controls the DPA 740 in a discrete switching manner. Phase and amplitude modulating signals 721, 722 may be generated by a digital baseband circuitry 720 as binary signals. Baseband circuitry 720 may for example derive signals 721, 722 from the in-phase (I) and quadrature phase (Q) portions of a binary time domain information signal.

As used in this application, the term "circuitry" may refer to one or more or all of the following
 (a) hardware-only circuit implementations such as implementations in only analog and/or digital circuitry and
 (b) combinations of hardware circuits and software, such as (as applicable):
  (i) a combination of analog and/or digital hardware circuit(s) with software/firmware and
  (ii) any portions of hardware processor(s) with software (including digital signal processor(s), software, and memory(ies) that work together to cause an apparatus, such as a mobile phone or server, to perform various functions) and
 (c) hardware circuit(s) and/or processor(s), such as microprocessor(s) or a portion of a microprocessor(s), that utilizes software (for example, firmware) for operation, but the software may not be present when it is not needed for operation.

This definition of circuitry applies to all uses of this term in this application, including in any claims. As a further example, as used in this application, the term circuitry also covers an implementation of merely a hardware circuit or processor (or multiple processors) or portion of a hardware circuit or processor and its (or their) accompanying software and/or firmware. The term circuitry also covers, for example and, if applicable, to the particular claim element, a baseband integrated circuit or processor integrated circuit for a mobile device or a similar integrated circuit in a server, a cellular network device, or other computing or network device.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims.

It will furthermore be understood by the reader of this patent application that the words "comprising" or "comprise" do not exclude other elements or steps, that the words "a" or "an" do not exclude a plurality, and that a single element, such as a computer system, a processor, or another integrated unit may fulfill the functions of several features described herein. The terms "first", "second", "third", "a", "b", "c", and the like, when used herein, are introduced to distinguish between similar elements or steps and are not necessarily describing a sequential or chronological order. It is to be understood that embodiments described herein are capable of operating according to the disclosed technology in other sequences, or in orientations different from the one(s) described or illustrated above.

What is claimed is:

1. A sign switching circuitry comprising:
  a first and second differential common-source amplifier having common differential input nodes and common differential output nodes configured such that a differential input signal applied at the common differential input nodes is amplified to a differential output signal at the common differential output nodes with a fixed gain by the first differential common-source amplifier and by the fixed gain with an opposite sign by the second differential common-source amplifier; and
  a switching circuitry configured to activate the first differential common-source amplifier and deactivate the second differential common-source amplifier to amplify the differential input signal by the fixed gain, and to activate the second differential common-source amplifier and deactivate the first differential common-source amplifier to amplify the differential input signal by the fixed gain with the opposite sign, wherein each common differential output node is directly connected to a drain node of the respective differential common-source amplifier.

2. The sign switching circuitry of claim 1, wherein the switching circuitry comprises a first switch configured to connect a source node of the first differential common-source amplifier with a first supply node of a voltage supply when activating the first differential common-source amplifier, and a second switch to connect a source node of the second differential common-source amplifier with the first supply node when activating the second differential common-source amplifier.

3. The sign switching circuitry of claim 2, wherein the first switch is further configured to connect the source node of the first differential common-source amplifier with a second supply node of the voltage supply when activating the second differential common source amplifier, and wherein the second switch is further configured to connect the source node of the second differential common-source amplifier with the second supply node of the voltage supply when activating the first differential common-source amplifier.

4. The sign switching circuitry of claim 2, wherein the first and/or second switches are inverter switches.

5. The sign switching circuitry of claim 2, wherein the first supply node is a common ground node.

6. A variable gain circuitry configured to amplify an analog input signal by a configurable positive or negative gain to an analog output signal, the variable gain circuitry comprising a plurality of the sign switching circuitries of claim 1, the plurality of sign switching circuitries connected in parallel such that the differential output signals of the respective sign switching circuitries contribute to the analog output signal.

7. The variable gain circuitry of claim 6, wherein the common differential output nodes of the respective sign switching circuitries are connected together, thereby forming differential output nodes of the variable gain circuitry for outputting the analog output signal.

8. The variable gain circuitry of claim 6, further comprising a decoding circuitry configured to decode the configurable positive or negative gain to sign switching commands for the respective sign switching circuitries.

9. A phase changing circuitry configured to shift or modulate a phase of an input signal by a configurable phase angle comprising:
  a plurality of the sign switching circuitries of claim 1; and
  one or more variable gain circuitries,
    wherein each variable gain circuitry is configured to amplify an analog input signal by a configurable positive or negative gain to an analog output signal, and
    wherein the plurality of the sign switching circuitries are connected in parallel such that the differential output signals of the respective sign switching circuitries contribute to the analog output signal.

10. The phase changing circuitry of claim 9, wherein the plurality of the sign switching circuitries and the one or more variable gain circuitries are configured to switch a sign of an in-phase (I) and/or quadrature-phase (Q), portion of the input signal.

11. A radio frequency (RF) circuitry comprising the phase changing circuitry of claim 9.

12. A method of switching sign of a signal by a sign switching circuitry according to claim 1, the method comprising:
  applying a differential input signal at the common differential input nodes; and
  generating a differential output signal at the common differential output nodes by amplifying the differential input signal with a fixed gain by the first differential common-source amplifier and by the fixed gain with an opposite sign by the second differential common-source amplifier.

13. The method of claim 12, further comprising:
  activating, via a switching circuitry, the first differential common-source amplifier, and deactivating the second differential common-source amplifier to amplify the differential input signal by the fixed gain.

14. The method of claim 12, further comprising:
  activating, via a switching circuitry, the second differential common-source amplifier, and deactivating the first differential common-source amplifier to amplify the differential input signal by the fixed gain with the opposite sign.

15. A sign switching circuitry comprising:
  a first and second differential common-source amplifier having common differential input nodes and common differential output nodes configured such that a differential input signal applied at the common differential input nodes is amplified to a differential output signal at the common differential output nodes with a fixed gain by the first differential common-source amplifier and by the fixed gain with an opposite sign by the second differential common-source amplifier; and
  a switching circuitry configured to activate the first differential common-source amplifier and deactivate the second differential common-source amplifier to amplify the differential input signal by the fixed gain, and to activate the second differential common-source amplifier and deactivate the first differential common-source amplifier to amplify the differential input signal by the fixed gain with the opposite sign, wherein each differential common-source amplifier comprises a first metal-oxide-semiconductor field-effect (MOSFET) transistor and a second MOS FET transistor, wherein gates of respective MOSFET transistors are connected to the respective common differential input nodes, and wherein drains of respective MOS transistors are directly connected to respective common differential output nodes.

16. The sign switching circuitry of claim 15, wherein the drains of the first and second MOSFET transistors in the first differential common-source amplifier are connected directly together with the first and second MOSFET transistors in the second differential common-source amplifier in a cross coupled fashion.

17. A variable gain circuitry configured to amplify an analog input signal by a configurable positive or negative gain to an analog output signal, the variable gain circuitry comprising a plurality of the sign switching circuitries of claim 15, the plurality of sign switching circuitries connected in parallel such that the differential output signals of the respective sign switching circuitries contribute to the analog output signal.

18. The variable gain circuitry of claim 17, wherein the common differential output nodes of the respective sign switching circuitries are connected together, thereby forming differential output nodes of the variable gain circuitry for outputting the analog output signal.

19. The variable gain circuitry of claim 17, further comprising a decoding circuitry configured to decode the configurable positive or negative gain to sign switching commands for the respective sign switching circuitries.

* * * * *

UNITED STATES PATENT AND TRADEMARK OFFICE
CERTIFICATE OF CORRECTION

PATENT NO. : 11,791,785 B2
APPLICATION NO. : 17/128537
DATED : October 17, 2023
INVENTOR(S) : Khalaf et al.

It is certified that error appears in the above-identified patent and that said Letters Patent is hereby corrected as shown below:

In the Specification

Column 1, Line 21, delete "circuity" and insert -- circuitry --.

Column 1, Line 23, delete "signal" and insert -- signal. --.

Column 2, Line 2, delete "deferential" and insert -- differential --.

Column 2, Line 4, delete "circuity," and insert -- circuitry, --.

Column 4, Line 54, delete "ISO" and insert -- 150 --.

Column 6, Line 12, delete "embodiment" and insert -- embodiment. --.

Column 7, Line 33, delete "circuity" and insert -- circuitry --.

Column 8, Line 31, delete "following" and insert -- following: --.

In the Claims

Column 11, Line 5, In Claim 15, delete "MOS FET" and insert -- MOSFET --.

Signed and Sealed this
Ninth Day of January, 2024

Katherine Kelly Vidal
*Director of the United States Patent and Trademark Office*